United States Patent [19]

Suzuki et al.

[11] Patent Number: 5,093,168

[45] Date of Patent: Mar. 3, 1992

[54] IMAGE-RECEIVING SHEET ELEMENT WITH LINEAR POLYETHYLENE COVER SHEET

[75] Inventors: Tamotsu Suzuki; Tomizo Namiki; Masashi Katayama, all of Shizuoka, Japan

[73] Assignee: Fuji Photo Film Co., Ltd., Kanagawa, Japan

[21] Appl. No.: 589,572

[22] Filed: Sep. 28, 1990

[30] Foreign Application Priority Data

| Sep. 28, 1989 [JP] | Japan | 1-253255 |
| Sep. 28, 1989 [JP] | Japan | 1-253256 |
| Sep. 28, 1989 [JP] | Japan | 1-253257 |
| Sep. 28, 1989 [JP] | Japan | 1-253258 |
| Sep. 28, 1989 [JP] | Japan | 1-253259 |
| Sep. 28, 1989 [JP] | Japan | 1-253260 |

[51] Int. Cl.$^5$ .................. A61F 13/02; G03C 11/12; G03C 1/90
[52] U.S. Cl. .................. 428/40; 428/476.1; 428/516; 428/518; 428/523; 430/256; 430/257; 430/259; 430/262; 430/263
[58] Field of Search .............. 430/259, 258, 260, 257, 430/262, 263, 256; 428/40, 523, 518, 516, 476.1

[56] References Cited

U.S. PATENT DOCUMENTS

| 4,318,975 | 3/1982 | Kuznetsov et al. | 430/260 |
| 4,567,128 | 1/1986 | Bennett | 430/260 |
| 4,766,053 | 8/1988 | Shinozaki et al. | 430/258 |
| 4,933,258 | 6/1990 | Shinozaki et al. | 430/262 |

*Primary Examiner*—Richard L. Schilling
*Attorney, Agent, or Firm*—Sughrue, Mion, Zinn, Macpeak & Seas

[57] ABSTRACT

An image-receiving sheet element comprising an image-receiving layer provided on a flexible substrate and a removable cover sheet, wherein said cover sheet comprises a low density copolymer containing 30% by weight or more of a linear polyethylene, is described. This image-receiving sheet element shows improved slip properties and a good workability, and little deterioration in transfer properties upon prolonged storage. Furthermore, it scarcely suffers from any caused by static electricity when the cover sheet is peeled off from the image-receiving sheet.

10 Claims, No Drawings

IMAGE-RECEIVING SHEET ELEMENT WITH LINEAR POLYETHYLENE COVER SHEET

FIELD OF THE INVENTION

This invention relates to an image-receiving sheet element which is useful particularly for the preparation of a color proof for color correction.

BACKGROUND OF THE INVENTION

There are known processes comprising exposing a light-sensitive laminate, wherein a peel layer comprising an organic polymer and a light-sensitive resin layer are provided on a provisional substrate, developing said laminate so as to form an image on the peel layer and then transferring said image onto an arbitrary substrate (described, e.g., in JP-B-46-15326 and JP-B-49-441, which corresponds to U.S. Pat. No. 3,721,557; the term "JP-B" as used herein means an "examined Japanese patent publication"). These processes are advantageous in that they can be applied as a color proof both of over-lay type and surprint type. However, they suffer from some disadvantages, such as that an adhesive should be used for each transfer, which makes the procedure troublesome, and that it is difficult to achieve a high accuracy at site-matching in the transfer of each color.

JP-A-47-41830, JP-A-48-93337 and JP-A-51-5101 each propose a process for relieving the troublesome procedure by adhering a formed image to an image-receiving sheet and applying heat and pressure to said image-receiving sheet so as to transfer said image. The term "JP-A" as used herein means "unexamined published Japanese patent application". JP-A-51-5101 discloses, in particular, a process wherein a hot-melt polymer layer is provided as an adhesive on a temporary substrate, while JP-A-47-41830 discloses a process for directly transferring an image onto a permanent substrate such as art paper or coated paper.

However, these processes have several disadvantages. One disadvantage resides in that the final image obtained thereby is reversed right and left with respect to the original. Another disadvantage resides in that the use of a hot-melt polymer of a high melting point requires an elevated transfer temperature, which lowers the dimensional stability of the substrate and causes a shift in site-matching at the transfer of each color. When a polymer of a low melting point is employed, on the other hand, problems such as adhesion after the formation of an image or the occurrence of marks frequently occur. In order to overcome these disadvantages, JP-A-59-97140, which corresponds to U.S. Pat. No. 4,482,625, discloses a process wherein an image of each color is once transferred onto an image-receiving sheet provided with a photopolymerizable image-receiving layer, and then said image is retransferred onto the permanent substrate followed by hardening said photopolymerizable image-receiving layer through exposure. The image obtained by this process is positive with respect to the mask original. Further, the photopolymerizable image-receiving layer containing an ethylenically polyfunctional monomer is soft per se. Thus the transfer can be effected at a low temperature and the photopolymerizable image-receiving layer is hardened thereafter by exposure, which makes said layer highly resistant against adhesion and marks. Therefore, most of the above-mentioned disadvantages are overcome thereby.

The image-receiving sheet is provided to users as the image-receiving layer is provided with a cover sheet so as to prevent said image-receiving layer from staining and marks. Thus, the cover sheet should be removed by users immediately before use.

However, the use of a conventional cover sheet suffers from several problems, as described below.

(1) When an image is to be transferred from the image-forming material to the image-receiving sheet, poor slip between the image-receiving layer surface of the image-receiving sheet and the image-forming material sometimes causes contamination bubbles between them, which results in the deterioration of the image, which is a fatal injury in the case of a color proof.

(2) Poor slip between the substrate of the image-receiving sheet and a cover sheet or between cover sheets can make handling difficult.

(3) When the image-receiving sheet is exposed to ultraviolet light during prolonged storage, the transferability is sometimes deteriorated.

(4) It is difficult to tell which is the face of the image-receiving sheet element, which makes the workability poor.

(5) With the lapse of time, additives contained in the image-receiving sheet would migrate toward the surface of the cover sheet, which is accompanied by the deterioration in the performance of the image-receiving sheet and staining of the surface. Further, the transferability is deteriorated by moisture or air penetrating from the outside.

(6) Static electricity makes it difficult to peel the cover sheet from the image-receiving sheet. Furthermore, static electricity sometimes makes the cover sheet after peeling electrostatic, so as to stick to the image-receiving sheet, substrate, or hands.

SUMMARY OF THE INVENTION

It is an object of the present invention to solve the above-mentioned problems. This object has now been achieved by providing a particular image-receiving sheet element having desirable characteristics, as described below.

Accordingly, the present invention provides image-receiving sheet elements as follows.

(1) An image-receiving sheet element comprising an image-receiving layer provided on a flexible substrate and a removable cover sheet wherein said cover sheet comprises a polymer containing 30% by weight or more of a linear polyethylene.

(2) As an embodiment of the present invention, an image-receiving sheet element as specified in (1) above wherein said cover sheet contains a matting agent.

(3) As another embodiment of the present invention, an image-receiving sheet element as specified in (1) above wherein said cover sheet contains an ultraviolet absorber and/or is provided with a layer containing an ultraviolet absorber.

(4) As another embodiment of the present invention, an image-receiving sheet element as specified in (1) above wherein at least some part of said cover sheet is colored.

(5) As another embodiment of the present invention, an image-receiving sheet element as specified in (1) above wherein said cover sheet comprises at least two layers, one of which, not contacting with said image-receiving layer, comprises at least one material selected from a group consisting of a polymer containing 50 mol % by mol or more of vinylidene chloride, polypropylene, nylon, and polyethylene terephthalate.

(6) As another embodiment of the present invention, an image-receiving sheet element as specified in (1) above wherein said cover sheet contains an antistatic agent and/or is provided with a layer containing an antistatic agent.

(7) As another embodiment of the present invention, an image-receiving sheet element as specified in (1) above wherein said cover sheet contains a slip agent and/or is provided with a layer containing a slip agent.

DETAILED DESCRIPTION OF THE INVENTION

Now the image-receiving sheet element of the present invention is described in further detail.

As the image-receiving layer of the image-receiving sheet element of the present invention, any known may be used, so long as it can receive an image. An image-receiving layer with respect to which photopolymerizability allowing hardening by exposure is imparted so as to enhance the image film strength after image-transfer (which will be called a photopolymerizable image-receiving layer hereinafter) is particularly useful. The photopolymerizability thus imparted exerts another effect. That is to say, an image transferred onto the image-receiving layer is a reverse image, which is preferably retransferred onto a white paper sheet used in printing. The image-receiving layer hardened by exposure generally shows a low adhesitivity to the substrate, which makes it easy to peel said image-receiving layer from the substrate at the time of retransfer onto the white paper.

The term "photopolymerizable" as used herein means a system wherein the molecular weight of at least one of the components of a light-sensitive layer is increased by ultraviolet-irradiation to a level sufficient for causing a change in the rheological and thermal behavior of the exposed part.

A photopolymerizable image-receiving layer suitable for the present invention comprises:

(a) a polyfunctional vinyl or vinylidene compound capable of forming a photopolymer by at least one addition polymerization;

(b) an organic polymeric binder; and (c) a photopolymerization initiator which is activated by active rays:

as well as a thermal polymerization inhibitor, if required.

Preferable examples of the vinyl monomer or vinylidene compound to be used in the present invention are unsaturated polyol esters, in particular, acrylates and methacrylates. Particular examples thereof include ethylene glycol diacrylate, glycerol triacrylate, polyacrylate, ethylene glycol dimethacrylate, 1,3-propanediol dimethacrylate, polyethylene glycol dimethacrylate, 1,2,4-butanetriol trimethacrylate, trimethylolethane triacrylate, pentaerythritol dimethacrylate, pentaerythritol trimethacrylate, pentaerythritol tetramethacrylate, pentaerythritol diacrylate, pentaerythritol triacrylate, pentaerythritol tetraacrylate, dipentaerythritol polyacrylate, 1,3-propanediol diacrylate, 1,5-pentanediol dimethacrylate, polyethylene bisacrylate or bismethacrylate having a molecular weight of 200 to 400 and similar compounds; unsaturated amides, in particular, unsaturated acrylamides or methacrylamides having $\alpha$, $\omega$-diamine, whose alkylene chain may be interrupted with an oxygen atom, and ethylene bismethacrylamide, although the present invention is not restricted thereto.

As the photopolymerization initiator, those showing less absorption in the visible region are preferable. Examples thereof include aromatic ketones such as benzophenone, Michler's ketone [4,4'-bis(dimethylamino)benzophenone], 4,4'-bis(diethyl-amino)benzophenone, 4-methoxy-4'-dimethylaminobenzophenone, 2-ethylanthraquinone, phenanthraquinone and others; benzoin ethers such as benzoin, benzoin methyl ether, benzoin ethyl ether and benzoin phenyl ether; benzoins such as methyl benzoin, ethyl benzoin and others; and triarylimidazole dimers such as 2-(o-chlorophenyl)-4,5-diphenylimidazole dimer, 2-(o-chlorophenyl)-4,5-(m-methoxyphenyl)imidazole dimer, 2-(o-fluorophenyl)-4,5-diphenylimidazole dimer, 2-(o-methoxyphenyl)-4,5-diphenyl-imidazole dimer, 2-(p-methoxyphenyl)-4,5-diphenyl-imidazole dimer, 2,4-di(p-methoxyphenyl)-5-phenylimidazole dimer, 2-(2,4-dimethoxyphenyl)-4,5-diphenylimidazole dimer, 2-(p-methyl-mercaptophenyl)-4,5-diphenylimidazole dimer and 2,4,5-triarylimidazole dimers described in U.S. Pat. Nos. 3,479,185 and 3,784,557 and British Patent 1,047,569; though the present invention is not restricted thereby.

As the organic polymeric binder, vinyl polymeric materials are particularly preferable from the viewpoints of (1) thermal plasticity for achieving excellent image transfer and (2) compatibility with the above-mentioned monomer compounds and photopolymerization initiators. Examples of the vinyl polymer materials include various materials such as polyvinyl chloride, polyacrylic acid, polymethyl acrylate, polyethyl acrylate, polybutyl acrylate, polymethacrylic acid, polymethyl methacrylate, polyvinyl ether, polyvinyl acetal and copolymers thereof, though the present invention is not restricted thereby.

The appropriate ratio of the monomer compound to the organic polymer binder varies depending on the combination of the monomer compound and the organic polymer binder. Generally speaking, the weight ratio of the monomer to the binder may preferably range from 1/10 to 2/1. On the other hand, the photopolymerization initiator may be preferably added in an amount of from 0.01 to 20% by weight, based on the weight of the monomer compound.

Examples of the thermal polymerization inhibitor include p-methoxyphenol, hydroquinone, alkyl- or aryl-substituted hydroquiones, tert-butyl cathecol, pyrogallol, naphthylamine, $\beta$-naphthol, phenathiazine, pyridine, nitrobenzene, o-toluquinone, and aryl phosphites, though the present invention is not restricted thereto.

The photopolymerizable image-receiving layer has a film thickness at least sufficient for embedding and transferring four color images from the image-forming material. The coating ratio of the photopolymerizable image-receiving layer may preferably range from 4 to 40 g/m$^2$, though it varies depending on the film thickness of the color images. Details of such a photopolymerizable image-receiving layer are described, e.g., in JP-A-59-97140.

Furthermore, a two-layer image-receiving layer disclosed in JP-A-61-189535, which corresponds to U.S. Pat. No. 4,766,053, is useful in the present invention. Details thereof are described in said patent.

A cover sheet is provided on the image-receiving layer. As the cover sheet, a polymer containing a linear (long chain type) polyethylene, which has a high dimensional stability, high flexibility, high adhesitivity to the image-receiving layer, high resistance against marks, and excellent durability, is preferable.

The term "linear polyethylene" as used herein means a straight chain polyethylene having no long branched chain, but having short branched chains, which is obtained by copolymerizing ethylene with α-olefins of C-3 or above by medium- or low-pressure polymerization.

Examples of the α-olefins of C-3 or above include butene-1, hexene-1, and octene-1.

As the α-olefins, those of C-4 or above are preferable, and those of C-6 or above are still more preferable.

In the present invention, a polymer containing a linear polyethylene as the major component may be used. In this case, said copolymer generally contains 30% by weight or more, preferably 45% by weight or more, and still more preferably 60% by weight or more, of the linear polyethylene. It is preferable that the balance of the component(s) comprises common polyethylene. "Common polyethylene" means the polyethylene other than a linear polyethylene as defined above. The density of the polymer preferably ranges from 0.91 to 0.95.

It is preferable in the present invention that the surface of said cover sheet is appropriately roughened. The roughening may be preferably conducted to such an extent as to give a distance between peaks of approximately 2 μm and a peak/valley value of from 0.1 to 5 μm, still preferably from 0.1 to 3 μm. The roughening may be conducted simply by subjecting the polymer containing the linear polyethylene to film-formation so as to give an uneven surface. However, it is more effective that a matting agent such as silica is contained at least in the face of the cover sheet to be contacted with the image-receiving layer. Thus a known matting agent may be added to the polymer containing the linear polyethylene. Alternately, said cover sheet may consist of two layers and a matting agent may be added to the one to be contacted with the image-receiving layer. Furthermore, the cover sheet may consist of three layers and a matting agent may be added to the one to be contacted with the image-receiving layer and to the opposite layer. The content of the matting agent preferably ranges from 0.5 to 2.0% by weight based on the total weight of the cover sheet.

Such a polymer sheet may be produced by two-layer or three-layer extrusion. During this step, a matting agent may be added to the layer(s) requiring the same.

When the cover sheet is peeled off from the image-receiving layer at the time of use, the surface of the image-receiving layer is roughened by the roughened surface of the cover sheet. When an image is transferred from the image-forming material to the image-receiving layer, these materials show good slip and no bubble formation even though air penetrates between them. Thus, the image is not deteriorated.

When both sides of the three-layer cover sheet are roughened, furthermore, the handling properties of the image-receiving sheet material are extremely improved.

Furthermore, it is preferable that said cover sheet contains an ultraviolet absorber and/or is provided with a layer containing an ultraviolet absorber.

As the ultraviolet absorber, a number commercially marketed are available. For example, those listed in Ciba-Geigy's catalogue of polymer additives (published on July 1, 1985) may be used. Particular examples thereof include salicylate ester compounds such as phenyl salicylate and p-tert-butylphenyl salicylate; benzophenone compounds such as 2,4-dihydroxybenzophenone and 2-hydroxy-4-methoxybenzophenone; benzotriazole compounds such as 2(2'-hydroxy-5'-methylphenyl)benzotriazole and 2(2'-hydroxy-3'-tert-butyl-5'-methylphenyl)-5-chlorobenzotriazole; cyanoacrylate compounds such as 2-ethylhexyl-2-cyano-3,3'-diphenyl acrylate and ethyl-2-cyano-3,3'-diphenyl acrylate; and nickel complex salts such as nickel-bis(octylphenyl) sulfide and [2,2'-thiobis(4-tert-octyl-phenolate)-n-butylamine-nickel. It is particularly preferable to use benzotriazole compounds of the structure

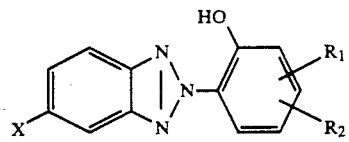

wherein X represents a hydrogen atom or a halogen atom; and $R_1$ and $R_2$ each represents an alkyl or an aryl group.

The content of the ultraviolet absorber may range from 0.001 to 30% by weight, preferably is from 0.01 to 20% by weight, and still more preferably from 0.05 to 10% by weight.

It is preferable in the present invention that some part of the above-mentioned cover sheet is colored. The coloration may be conducted, for example, by kneading a color material into the cover sheet per se, applying a layer containing a color material or printing some part of the cover sheet.

The hue, coloring density and the area of the colored part may be appropriately selected by those skilled in the art in such a manner that the face of the cover sheet can be distinguished. It is preferable, however, that the hue is different from that of the image-forming layer.

A color material, if used, may be selected from those excellent in heat resistance and dispersibility. More particularly, titanium oxide and anthraquinone blue dyes may be used therefor.

It is preferable that the cover sheet of the present invention comprises at least one layer not to be contacted with the image-receiving layer, containing a material having a low moisture-permeability. Examples of such a material include a polymer containing 50% by mol or more of vinylidene chloride, polypropylene, nylon, and polyethylene terephthalate. Among these materials, a polymer containing 50% by mol or more of vinylidene chloride and polypropylene are particularly preferable. In the use of a polymer containing vinylidene chloride, vinylidene chloride may be copolymerized with vinyl chloride or acrylonitrile.

In one preferred construction, the cover sheet may consist of two layers, wherein one to be contacted with the image-receiving layer comprises the above-described polymer containing linear polyethylene and another comprises this material with a low moisture-permeability.

Additionally, the cover sheet consisting of three layers is another preferred construction, wherein the layer comprising the material with a low moisture-permeability is held between the layers comprising the polymer containing linear polyethylene.

The cover sheet may be formed by a known method such as co-extrusion or coating. Refer, e.g., to "Injection Molding Theory and Practice", Irvin I. Rubin, A Wiley-Interscience Publication (1972) and "Plastic Sheet no Oshidashi Gijutsu", Kimimasa Ito, Kogyo Chosa-kai (1969).

It is preferable in the present invention that the above-mentioned cover sheet contains an antistatic agent and/or is provided with a layer containing a antistatic agent.

Useful antistatic agent includes those cited in "Seidenki Handbook", Kobunshi Gakkai, Chinin-sha (1978), 365–376; "Dodensei Polymer", Susumu Yoshimura, Kobunshi Gakkai ed., Kyoritsu Shuppan (1987); and "Dodensei Polymer no Kenkyu to Oyo", V. E. Cool, Yokokawa Shoten (1970). Particular examples thereof include anionic surfactants such as sodium alkyl phosphates and sodium alkyl phenol polyethylene glycol sulfate; cationic surfactants such as aliphatic amine derivatives and quaternary ammonium compounds; and nonionic surfactants such as polyoxyethylene fatty acid esters and polyoxyethylene alkyl ethers.

Furthermore, it is preferable in the present invention that the above-mentioned cover sheet contains a slip agent and/or is provided with a layer containing a slip agent. As the slip agent, higher fatty acids having 10 or more carbon atoms or higher fatty acid amides may be preferably used. Further, metal soaps, natural waxes, carnauba wax, and hydrocarbons such as petroleum waxes such as paraffin wax may be used therefor. As a preferable example thereof, stearic acid amide may be cited.

The total thickness of the cover sheet may range from 6 to 200 $\mu$m, and preferably is from 20 to 50 $\mu$m.

As the substrate, a material which is stable to chemicals and heat and has flexibility is used. It may be actinic ray-permeable, if required. Particular examples thereof include polyolefins such as polyethylene and polypropylene, polyvinyl halides such as polyvinyl chloride and polyvinylidene chloride, cellulose derivatives such as cellulose acetate, nitrocellulose and cellophane, polyamides, polystyrene, polycarbonates, polyimides and laminates thereof. Among these materials, a biaxially oriented polyethylene terephthalate film, which is excellent in dimensional stability and transparency, is particularly preferable.

It is preferable to apply a conductive layer to the substrate or to knead a conductive material thereto so as to make the substrate conductive, thus inhibiting the occurrence of static electricity at the use. In this case, it is also possible to enhance the adhesion of the substrate to the conductive layer through a surface treatment such as corona treatment, glow discharge, surface-matting or ultraviolet light irradiation, or by providing an undercoat layer.

It is furthermore possible to knead fine particles into the substrate so as to mat the surface.

The thickness of the substrate may appropriately range from 50 to 300 $\mu$m, and preferably is from 75 to 150 $\mu$m.

The transfer of an image formed on an image-forming material onto the image-receiving sheet element of the present invention and the retransfer of the image transferred on the image-receiving sheet element onto a permanent substrate may be conducted by known methods described, for example, in JP-A-59-97140.

To further illustrate the present invention, the following Examples will be given. It is to be understood, however, that the present invention is not restricted thereby.

EXAMPLE 1

A coating solution of the following composition was applied to a polyethylene terephthalate film (thickness: 100 $\mu$m) and dried so as to provide an image-receiving layer of 28 $\mu$m dry film thickness. Further, a linear polyethylene cover sheet (thickness: 30 $\mu$m, density: 0.935) comprising 1% silica of 5 $\mu$m in particle size was laminated thereon, to thereby provide an image-receiving sheet element.

| | |
|---|---|
| methyl methacrylate polymer | 90 g |
| (average molecular weight: 100,000, mfd. by Wako Pure Chemicals Co., Ltd.) | |
| pentaerythritol tetraacrylate | 90 g |
| Michler's ketone | 0.51 g |
| benzophenone | 3.18 g |
| p-methoxyphenol | 0.09 g |
| methyl ethyl ketone | 220 g |

On the other hand, an image-forming material wherein a peel layer and a sensitive resin layer were formed on a substrate was prepared in the following manner.

A coating solution of the following composition was applied to a polyethylene terephthalate film (thickness: 100 $\mu$m) and dried so as to provide a peel layer of a dry film thickness of 0.5 $\mu$m.

| | |
|---|---|
| alcohol-soluble polyamide | 7.2 g |
| (CM-8000, $\eta$ = 23 cps in 10% by wt. methanol solution at 20° C.; mfd. by Toray Industries, Inc.) | |
| polyhydroxystyrene | 1.8 g |
| (Resin M, average molecular weight: 5,500; mfd. by Maruzen Oil Co., Ltd.) | |
| methanol | 400 g |
| methyl cellosolve | 100 g |

Next, each of the four coating solutions (Y, M, C and B) as specified in Table 1 was applied to the peel layer and dried. Thus yellow (Y), magenta (M), cyan (C) and black (B) sensitive resin layers, each having a dry film thickness of 2.4 $\mu$m, were obtained.

Further, a coating solution of the following composition was applied onto each sensitive resin layer and dried, to thereby form a protective layer of 1.5 $\mu$m in dry film thickness. Thus four image-forming materials (negative/positive) Y, M, C and B were prepared.

| | |
|---|---|
| polyvinyl alcohol | 60 g |
| (GL-05, mfd. by Nippon Gosei Kagaku Kogyo K.K.) | |
| water | 970 g |
| methanol | 30 g |

On each of these four image-forming materials, the corresponding negative mask was properly placed by site-matching and fixed with register pins. Then, the sheet obtained was exposed with an ultra-high pressure mercury lamp (2 kW) 50 cm apart. Subsequently, each transfer sheet thus exposed was developed with a developing solution of the following composition at 35° C. for 15 seconds, to thereby form a positive image on the peel layer of the transfer sheet. Thus, color proofing sheets of four colors were obtained.

| | |
|---|---|
| $Na_2CO_3$ | 15 g |
| butyl cellosolve | 1 g |
| water | 1 l |

Next, the cover sheet was peeled from the image-receiving sheet element and the image-forming material having the black image was exactly placed on the image-receiving sheet by using register pins in such a manner that the image-forming material was contacted with the image-receiving layer of the sheet. Then the composite material thus formed was laminated with the use of a laminator (Fast Laminator 8B-550-80; mfd. by Taisei Shoji K.K.) under a pressure of 2 bar at a roller temperature of 120° C. and at a carry rate of 900 mm/min. After peeling the substrate of the image-forming material, a black image was obtained on the image-receiving sheet. This procedure was repeated regarding the residual three color image-forming materials. Thus an image-receiving layer on which black, cyan, magenta, and yellow images had been transferred was obtained.

By using the image-receiving sheet having the transferred image of the four colors, a color test sheet for surprinting was produced in the following manner.

The image-receiving sheet having the four color image was placed on a white art paper in such a manner that the image-receiving layer came into contact with the art paper. The obtained composite sheet was then sandwiched between an aluminum plate and a polyethylene terephthalate film and laminated under the same conditions as specified above.

When the substrate of the image-receiving sheet and the white art paper were peeled, peeling occurred at the interface of the substrate of the image-receiving sheet and the image-receiving layer. Thus an image closely similar to a printed one was obtained.

When the black image was transferred onto the image-receiving layer in the above procedure, excellent slip properties were achieved without showing the contamination of bubbles.

EXAMPLE 2

Coating solutions A and B of the following compositions were successively applied as image-receiving layers. Thus an image-receiving sheet having a sticky surface and comprising two layers of 20 μm and 1.5 μm in dry film thickness was prepared.

| Coating solution A | |
|---|---|
| ethylene/vinyl acetate copolymer (weight ratio: ethylene 81%, vinyl acetate 19%, "EVAFLEX #410" mfd. by Mitsui Polychemical K.K.) | 15 g |
| chlorinated polyethylene ("SUPERCHLON 907 LTA" mfd. by Sanyo-Kokusaku Pulp Co., Ltd.) | 0.075 g |
| fluorine surfactant ("FLUORAD FC-430" mfd. by Three-M Co.) | 0.25 g |
| toluene | 100 cc |
| Coating solution B | |
| polyvinyl butyral ("#2000-L" mfd. by Denki Kagaku Kogyo K.K.) | 4 g |
| fluorine surfactant ("FLUORAD FC-430" mfd. by Three-M Co.) | 0.05 g |
| methanol | 50 cc |
| methyl ethyl ketone | 20 cc |
| methyl cellosolve acetate | 20 cc |

On the image-receiving sheet thus obtained, a linear polyethylene cover sheet (thickness: 40 μm), consisting of three layers wherein 5% of silica particles were contained in the top and bottom layers, was laminated to thereby form an image-receiving sheet element.

Then an image for color correction was formed on a white art paper in the same manner as described in Example 1. As a result, excellent slip properties were achieved upon the transfer of a black image onto the image-receiving sheet, without showing any contamination of bubbles, similar to the case of Example 1.

COMPARATIVE EXAMPLE 1

The procedure of Example 1 was repeated to thereby prepare an image-receiving sheet and form an image, except that a branched low density polyethylene was used as the cover sheet. As a result, some bubbles invaded upon the transfer of the image onto the image-receiving layer and thus the image properties were deteriorated.

EXAMPLE 3 AND COMPARATIVE EXAMPLE 2

The procedure of Example 1 was repeated to thereby prepare an image-receiving sheet and form an image, except that a linear polyethylene cover sheet (thickness: 30 μm) containing 1% of tinuvin 900 (mfd. by Ciba-Geigy) as an ultraviolet absorber was used as the cover sheet.

An image-receiving sheet element stored in the dark and another one allowed to stand in a sunny window side for 30 days were subjected to the above procedure and the transfer properties were compared with each other.

In the case of the image-receiving sheet element of the present invention comprising a cover sheet containing the ultraviolet absorber showed substantially no deterioration in transfer properties.

In the case of an image-receiving sheet element comprising a cover sheet free from any ultraviolet absorber, on the other hand, the transfer could not be satisfactorily conducted. Namely, the contamination with small bubbles caused flotations in the final image.

EXAMPLE 4

The procedure of Example 2 was repeated to thereby prepare an image-receiving sheet and form an image, except that a linear polyethylene cover sheet (thickness: 40 μm) containing 1% of Sumisorb 300 (mfd. by Sumitomo Chemical Co., Ltd.) was used as the cover sheet.

Then the transfer properties of the obtained image-receiving sheet element were evaluated in the same manner as the one described in Example 3. Thus, results similar to those obtained in Example 3 were obtained.

EXAMPLE 5

The procedure of Example 1 was repeated to thereby prepare an image-receiving sheet and form an image, except that a linear polyethylene cover sheet (thickness: 30 μm), which had been colored blue by kneading titanium oxide was used as the cover sheet.

In the above procedure, the face of the image-receiving sheet could be easily distinguished when the cover sheet was peeled from the image-receiving layer.

EXAMPLE 6

The procedure of Example 2 was repeated to thereby prepare an image-receiving sheet and form an image, except that a linear polyethylene cover sheet (thickness: 40 μm), which had been colored red was used as the cover sheet.

Similar to Example 5, the face of the image-receiving sheet element thus obtained could be easily distinguished, which considerably improved the workability.

EXAMPLE 7 AND COMPARATIVE EXAMPLE 3

The procedure of Example 1 was repeated to thereby prepare an image-receiving sheet and form an image, except that a film (moisture permeability: $4.9 \times 10^{12}$ g·cm/cm$^2$·sec·cmHg), which had been prepared by adhering a linear polyethylene film (thickness: 30 μm) to a vinylidene chloride film (thickness: 30 μm) was used as the cover sheet.

An image-receiving sheet element stored at 45° C. under 70% RH (relative humidity) for 10 days was subjected to the above procedure.

As a result, the image-receiving sheet element suffered from no deposition on the surface of the cover sheet and showed stable transfer properties and image properties.

On the other hand, an image-receiving sheet element using a common polyethylene cover sheet (moisture permeability: $6.6 \times 10^{-12}$ g·cm/cm$^2$·sec·cmHg) was treated in the same manner. As a result, neither satisfactory transfer properties nor excellent image properties could be achieved in this case.

EXAMPLE 8

The procedure of Example 2 was repeated to thereby prepare an image-receiving sheet and form an image, except that a film moisture permeability: $4.5 \times 10^{-12}$ g·cm/cm$^2$·sec·cmHg), which had been formed by adhering a linear polyethylene film of 40 μm in thickness to a polyethylene terephthalate film of 6 μm in thickness was used as the cover sheet.

When the obtained image-receiving sheet element was evaluated in the same manner as the one described in Example 7, the results thus obtained were similar to those of Example 7.

EXAMPLE 9 AND COMPARATIVE EXAMPLE 4

The procedure of Example 1 was repeated, to thereby prepare an image-receiving sheet and form an image, except that a linear polyethylene cover sheet (thickness: 30 μm) containing 1% of dialkyl phosphate triethanolamine was used as the cover sheet.

In the above procedure, the peeling of the cover sheet from the image-receiving layer was not inhibited by static electricity.

In the case of an image-receiving sheet element using a cover sheet free from any antistatic agent, on the other hand, static electricity caused the adhesion of the cover sheet to the substrate of the image-receiving sheet element, which seriously deteriorated the workability.

EXAMPLE 10 AND COMPARATIVE EXAMPLE 5

The procedure of Example 2 was repeated to thereby prepare an image-receiving sheet and form an image, except that a linear polyethylene cover sheet (thickness: 40 μm) containing 1% of the antistatic agent of Example 9 was used as the cover sheet.

Then an image for color correction was formed on a white art paper in the same manner as the one described in Example 9. As a result, excellent peeling properties of the cover sheet were achieved, similar to Example 9.

On the other hand, a linear polyethylene cover sheet not containing any antistatic agent resulted in serious deterioration of the handling properties.

EXAMPLE 11 AND COMPARATIVE EXAMPLE 6

The procedure of Example 1 was repeated to thereby prepare an image-receiving sheet and form an image, except that a linear polyethylene cover sheet (thickness: 30 μm) containing 1% of stearic acid amide was used as the cove sheet.

When taken out of a box, this image-receiving sheet element showed good slip properties and thus could be easily taken out sheet by sheet.

On the other hand, a product consisting a cover sheet free from any slip agent showed poor slip properties. In this case, therefore, it was difficult to take out the image-receiving sheet element on a sheet by sheet basis.

EXAMPLE 12 AND COMPARATIVE EXAMPLE 7

The procedure of Example 2 was repeated to thereby prepare an image-receiving sheet and form an image, except that a linear polyethylene cover sheet (thickness: 40 μm) containing 1% of a wax of an average carbon atom number of 15 was used as the cover sheet.

Then an image for color correction was formed on a white art paper in the same manner as the one described in Example 11. As a result, excellent slip properties were achieved when the image-receiving sheet element was taken out of a box in a manner as in the case of Example 11.

When a linear polyethylene cover sheet free from any wax was employed, on the other hand, poor slip properties were observed.

TABLE 1

| | Y (g) | M (g) | C (g) | B (g) |
|---|---|---|---|---|
| Benzyl methacrylate/methacrylic acid copolymer (molar ratio: 73/27, viscosity $\eta$: 0.12) | 60 | 60 | 60 | 60 |
| Pentaerythritol tetraacrylate | 43.2 | 43.2 | 43.2 | 43.2 |
| Michler's ketone | 2.4 | 2.4 | 2.4 | 2.4 |
| 2-(o-Chlorophenyl)-4,5-diphenyl imidazole dimer | 2.5 | 2.5 | 2.5 | 2.5 |
| Seika First Yellow H-0755 (mfd. by Dainippon Seika Kogyo K.K.) | 9.4 | — | — | — |
| Cyanine Blue 4820 (mfd. by Dainippon Seika Kogyo K.K.) | — | — | 5.6 | — |
| Mitsubishi Carbon Black KA-100 (mfd. by Mitsubishi Chemical Industries, Ltd.) | — | — | — | 6.6 |
| Methyl cellosolve acetate | 560 | 560 | 560 | 560 |
| Methyl ethyl ketone | 280 | 280 | 280 | 280 |

Note:
Viscosity $\eta$ means the intrinsic viscosity in a methyl ethyl ketone solution at 25° C.

While the invention has been described in detail and with reference to specific examples thereof, it will be apparent to one skilled in the art that various changes and modifications can be made therein without departing from the spirit and scope thereof.

What is claimed is:

1. An image-receiving sheet element comprising an image-receiving layer provided on a flexible substrate and a removable cover sheet, wherein said cover sheet comprises a polymer containing 30% by weight or more of a linear polyethylene which is obtained by copolymerizing ethylene and α-olefins of C-3 or above by medium- or low-pressure polymerization.

2. An image-receiving sheet element as in claim 1, wherein said cover sheet contains a matting agent.

3. An image-receiving sheet element as in claim 2, wherein said cover sheet comprises at least two layers, and at least one of the layers contacting with the image-receiving layer contains a matting agent.

4. An image-receiving sheet element as in claim 2, wherein said cover sheet consists of three layers, and both external layers contain a matting agent.

5. An image-receiving sheet element as in claim 1, wherein said cover sheet contains an ultraviolet absorber and/or is provided with a layer containing an ultraviolet absorber.

6. An image-receiving sheet element as in claim 1, wherein at least some part of said cover sheet is colored.

7. An image-receiving sheet element as in claim 1, wherein said cover sheet contains an antistatic agent and/or is provided with a layer containing an antistatic agent.

8. An image-receiving sheet element as in claim 1, wherein said cover sheet contains a slip agent and/or is provided with a layer containing a slip agent.

9. An image-receiving sheet element as in claim 8, wherein said slip agent is a higher fatty acid or a higher fatty acid amide.

10. An image-receiving sheet element as in claim 1, wherein said cover sheet comprises at least two layers, one of which, not contacting with the image-receiving layer, comprises at least one material selected from among a polymer containing 50 mol % or more of vinylidene chloride, polypropylene, nylon, and polyethylene terephthalate.

* * * * *